US009091709B2

(12) United States Patent
Bolz

(10) Patent No.: US 9,091,709 B2
(45) Date of Patent: Jul. 28, 2015

(54) CIRCUIT ARRRANGEMENT FOR DETECTING A MAXIMUM IN THE PROFILE OF A MEASUREMENT SIGNAL

(75) Inventor: Stephan Bolz, Pfatter (DE)

(73) Assignee: Continental Automotive GmbH, Hannover (DE)

( * ) Notice: Subject to any disclaimer, the term of this patent is extended or adjusted under 35 U.S.C. 154(b) by 283 days.

(21) Appl. No.: 13/695,859

(22) PCT Filed: Apr. 29, 2011

(86) PCT No.: PCT/EP2011/056837
§ 371 (c)(1),
(2), (4) Date: Nov. 2, 2012

(87) PCT Pub. No.: WO2011/138242
PCT Pub. Date: Nov. 10, 2011

(65) Prior Publication Data
US 2013/0049739 A1    Feb. 28, 2013

(30) Foreign Application Priority Data

May 3, 2010   (DE) .......................... 10 2010 019 012

(51) Int. Cl.
*G01R 1/30*   (2006.01)
*G01R 19/30*  (2006.01)
*F02D 41/20*  (2006.01)

(52) U.S. Cl.
CPC .............. *G01R 19/30* (2013.01); *F02D 41/20* (2013.01); *F02D 2041/2051* (2013.01); *F02D 2041/2055* (2013.01); *F02D 2041/2075* (2013.01)

(58) Field of Classification Search
CPC ... H03F 1/00; H03F 2003/00; H03F 2200/00; H03F 2201/00; G01R 1/00; G01R 2019/00; H03G 1/00; H03G 2201/00
USPC ...................................................... 324/123 R
See application file for complete search history.

(56) References Cited

U.S. PATENT DOCUMENTS 4,700,143 A      10/1987  Anthony et al.
5,185,686 A  *   2/1993   Hansen et al. ................. 361/45
(Continued)

FOREIGN PATENT DOCUMENTS

DE            3531643 A1     3/1986
DE   10 2005 044 886 A1     4/2007
(Continued)

*Primary Examiner* — Huy Q Phan
*Assistant Examiner* — Temilade S Rhodes-Vivour
(74) *Attorney, Agent, or Firm* — Laurence A. Greenberg; Werner H. Stemer; Ralph E. Locher

(57) ABSTRACT

A circuit arrangement detects a maximum in a profile of a measurement signal. The circuit arrangement has an operational amplifier with a non-inverting input connected to a reference potential and an output connected to an inverting input via a first resistor. The first resistor has an input connection, to which the measurement signal is applied and which is connected to the inverting input of the operational amplifier via a series circuit containing a capacitor and a second resistor. The connection point between the capacitor and the second resistor is connected to the negative supply potential of the operational amplifier via a third resistor and a first, reverse-biased diode. The connection point between the third resistor and the first diode is connected to the output of the operational amplifier via a second, forward-biased diode. The reference potential is a positive potential.

1 Claim, 3 Drawing Sheets

(56) References Cited

U.S. PATENT DOCUMENTS

| | | | | |
|---|---|---|---|---|
| 5,210,397 | A | * | 5/1993 | Eastman ................ 235/462.16 |
| 5,767,724 | A | * | 6/1998 | Steglich ........................ 327/323 |
| 6,164,540 | A | * | 12/2000 | Bridgelall et al. ....... 235/462.01 |
| 7,454,299 | B2 | | 11/2008 | Bolz |
| 2005/0186917 | A1 | * | 8/2005 | Rofougaran et al. ........... 455/73 |
| 2010/0008007 | A1 | | 1/2010 | Barsky |
| 2012/0116702 | A1 | | 5/2012 | Beer et al. |

FOREIGN PATENT DOCUMENTS

| | | |
|---|---|---|
| DE | 10 2009 032 521 A1 | 1/2011 |
| WO | 94/13991 A1 | 6/1994 |

* cited by examiner

CIRCUIT ARRRANGEMENT FOR DETECTING A MAXIMUM IN THE PROFILE OF A MEASUREMENT SIGNAL

BACKGROUND OF THE INVENTION

Field of the Invention

In modern combustion engines the fuel is introduced into the combustion chamber by means of injectors. In order to be able to satisfy the strict requirements on the concentration of pollutants in the exhaust gas, and thereby the quality of combustion, it is necessary to know and to determine the moment of injection and the duration of the injection as accurately as possible.

Fuel injectors are frequently operated by coils, whereby an armature is moved, opening a valve when current flows in the coil. The moment of opening can be determined with sufficient accuracy from the start of the energization of the coil. The moment of closing, however, remains problematic, since the current flowing through the coil does not stop abruptly after the active energization of the coil is switched off, but rather has to decay in a freewheeling circuit due to the magnetic energy stored in the coil. For as long, however, as current, with a magnitude that is not accurately known, continues to flow in the coil, it is difficult to predict when the force generated by the magnetic field on the armature has become small enough to allow the spring force that acts in opposition to the force of the magnetic field to close the valve. In addition, not only is a reverse EMF generated by the coil's self-inductance, maintaining the flow of current and thereby the magnetic field, but a further component of induced voltage is superimposed onto this reverse EMF through the movement of the armature.

The question of whether the valve is open or closed depends on the position of the armature, so that the moment of closing can be deduced from knowledge of the armature position.

The application, not previously published, with file reference 10 2009 032 521.2-26 discloses a method for determining the moment of closure of a valve operated by a coil in which the difference is formed between a first voltage that is representative of the current flowing in the coil due to the decay of the magnetic energy stored in the coil taking place after the active energization of the coil has been switched off and due also to the induction resulting from the movement of the armature, and a second voltage that is representative of the component of the current flowing in the coil purely due to the decay of the magnetic energy stored in the coil, in order to obtain the component of the voltage generated by the induction resulting from the armature movement alone. The second voltage here is obtained at a discharging capacitor, whereby the charging of the capacitor is triggered by the high voltage spike that develops across the coil after the active energization has been switched off. The first voltage, and the charging voltage for the capacitor that is obtained from this, is derived through a voltage divider from the voltage developed across the coil as a result of the circuit arrangement with the voltage divider.

This first and the second voltages are supplied to a differential amplifier whose output signal is only the component of the coil voltage induced by the movement of the valve armature. The magnitude of this output signal includes at least one maximum in the signal profile, occurring at the moment when the valve closes due to the armature reaching its end position. The maximum in the signal profile can, of course, also be considered mathematically as a minimum, depending on which inputs to the differential amplifier are supplied with the first and second voltages.

Detecting the maximum in this signal profile through differentiation is already known from DE 101 50 199 AI. The zero-transit of this signal obtained through differentiation indicates the moment of closure, and is easily detected.

A circuit arrangement for detecting a maximum in the profile of a measurement signal having an operational amplifier, the non-inverting input of which is connected to a reference potential, the output of which is connected through a first resistor to the inverting input, and having an input connection, to which the measurement signal is applied and which is connected to the inverting input of the operational amplifier through a series circuit comprising a capacitor and a second resistor is known, for instance, from "Halbleiterschaltungstechnik" (Semiconductor Circuit Technology) by Tietze/Schenk, seventh edition, 1985, pages 312, 313, whereby the reference potential there is the ground potential. The second resistor gives the differentiator greater stability, but does lead to a phase-shift in the output signal, as a result of which the zero-transit that indicates the maximum of the measurement signal occurs too late in the output signal. This is not good enough for accurately detecting the moment of closure of a fuel valve.

BRIEF SUMMARY OF THE INVENTION

It is therefore the task of the invention to provide a circuit arrangement that makes a better solution available with little effort, and therefore economically.

The task is fulfilled by a circuit arrangement for detecting a maximum in the profile of a measurement signal, having an operational amplifier the non-inverting input of which is connected to a reference potential, the output of which is connected through a first resistor to the inverting input, having an input connection, to which the measurement signal is applied and which is connected to the inverting input of the operational amplifier through a series circuit comprising a capacitor and a second resistor, whereby the connection point between the capacitor and the second resistor is connected through a third resistor and a first, reverse-biased, diode to the negative supply potential of the operational amplifier, and whereby the reference potential is a positive potential—favorably, in the case of an operational amplifier with a positive supply potential of +5 V and a negative supply potential of 0 V, approximately +0.5 V. Moreover, the connection point between the third resistor and the first diode is connected to the output of the operational amplifier through a second, forward-biased diode.

The first diode serves to limit negative voltage excursions for the inverting input of the operational amplifier, whose negative supply potential is at the reference ground. The third resistor here serves to limit the current, so that the source that supplies the measurement signal is not too heavily loaded. This source is, in most cases, the output of an operational amplifier configured as a voltage amplifier. If this output is loaded with too low a resistance, this can result in phase shifts and parasitic oscillations.

The second diode limits its anode terminal to a value that is above the output potential of the inverting differentiator by the magnitude of the forward bias voltage. This clamping significantly increases the precision with which the differentiator responds, whilst at the same time strongly reducing its sensitivity to signal noise during the rising phase of the measurement signal.

The positive reference voltage at the non-inverting input of the operational amplifier of favorably +0.5 V is required because the forward voltage of the second diode is not 0 V but is in the region of 0.5 V to 0.7 V. Through this shift of 0.5 V in the reference potential of the differentiator, its critical point is placed just under the forward voltage of the second diode. Since, during the rising phase of the measurement signal, the voltage at the inverting input to the differentiator has approximately the value of the forward voltage of the second diode, this potential is above the voltage at the non-inverting input. As a consequence of this, the output of the differentiator is driven to negative saturation.

The invention is described in more detail below on the basis of an exemplary embodiment with the help of diagrams. They show:

DESCRIPTION OF THE INVENTION

Figure 1:
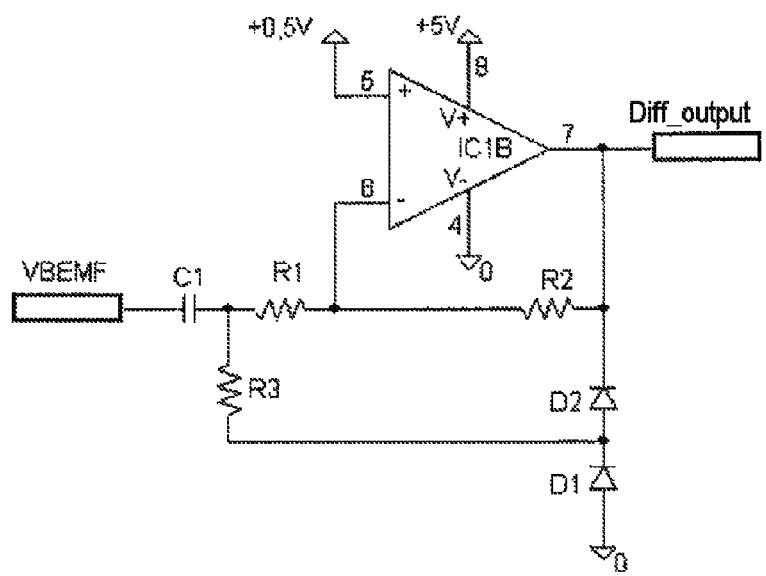
FIG. 1 a circuit arrangement according to the invention.

FIG. 1 shows an operational amplifier IC1B, whose positive supply potential is +5 V, and whose negative supply potential is 0 V. Its non-inverting input 5 is connected to a reference potential of +0.5 V. Its output 7 is connected through a first resistor R2 to the inverting input 6. One input VBEMF of the circuit arrangement is connected to the inverting input 6 of the operational amplifier IC1B through a series circuit comprising a capacitor C1 and a second resistor R1. To this extent, the circuit arrangement largely corresponds to that of a known differentiator.

According to the invention, the connection point of the capacitor C1 and the second resistor R1 is connected through a series circuit comprising a third resistor R3 and a first diode D1 to the negative supply potential 0 V. The connection point between the third resistor R3 and the first diode D1 is, moreover, connected through a second diode D2 to the output 7 of the operational amplifier IC1B.

Figure 3:
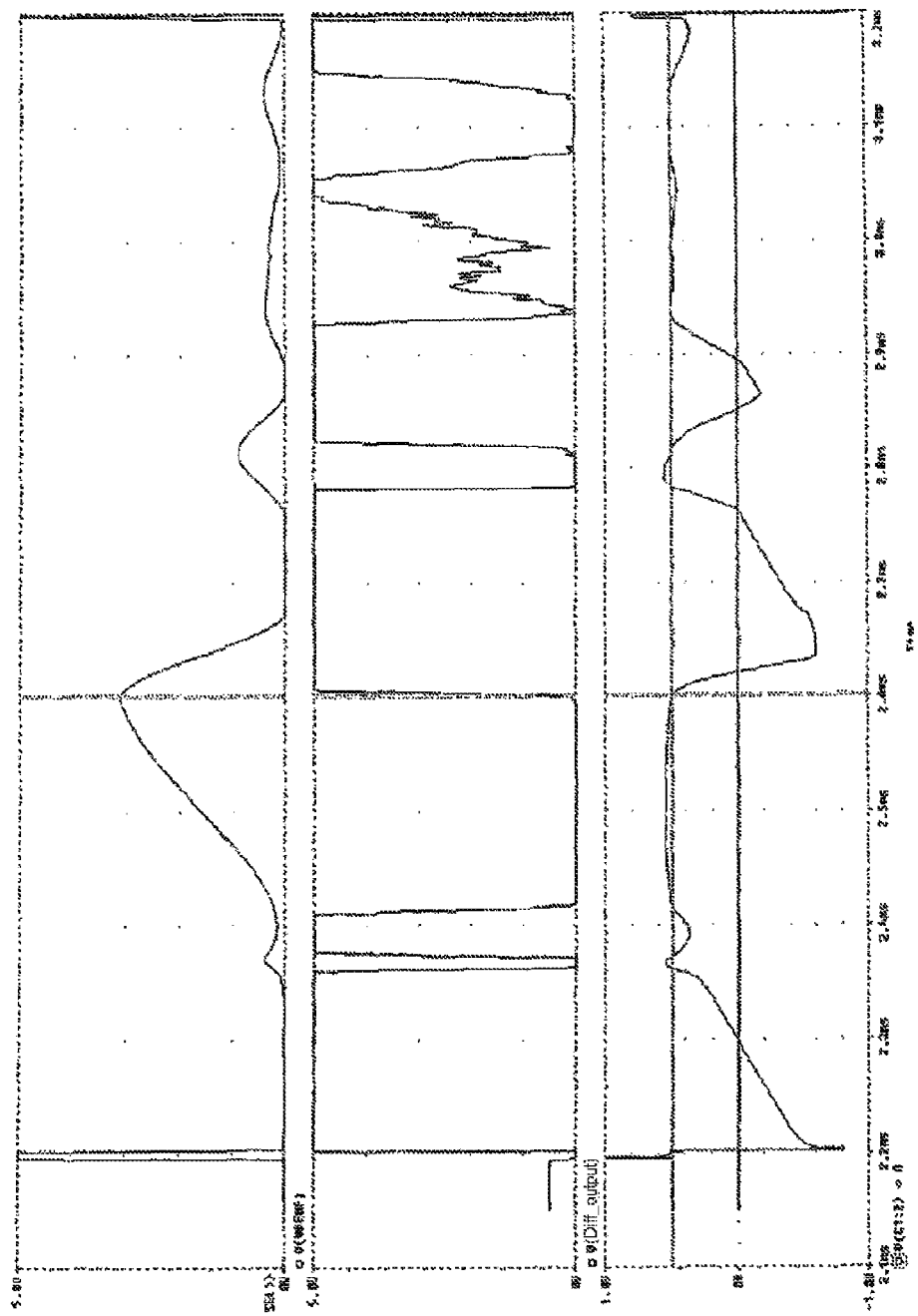
FIG. 3 the signal curves at the input, output and following the capacitor in the circuit arrangement of FIG. 1, and FIG. 4 the signal curves at the input, output and following the capacitor in the circuit arrangement of FIG. 2.
Figure 4:
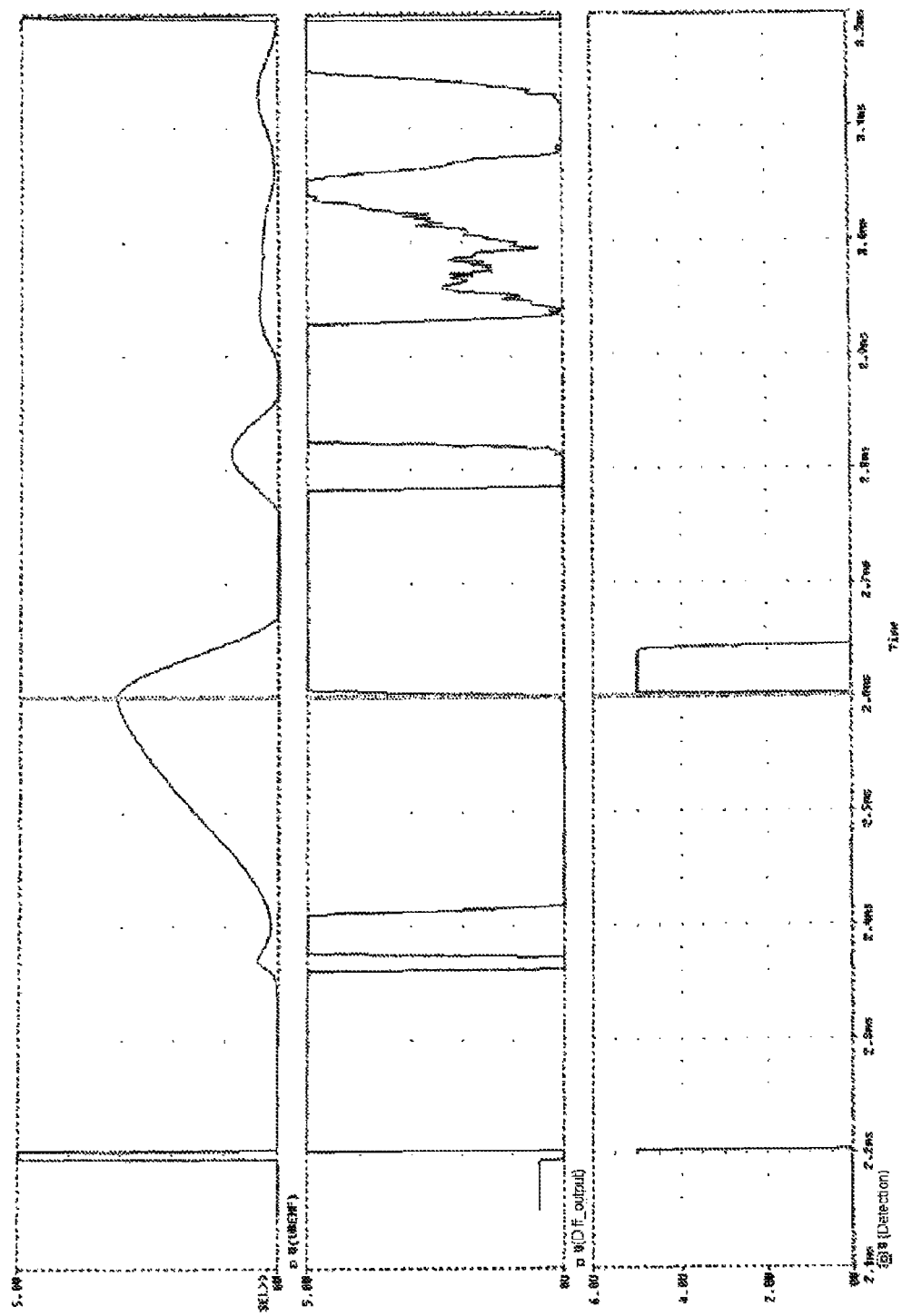

The curve shown in the middle of FIG. 3 represents the signal profile at the output of the circuit arrangement according to the invention, while the lower curve shows the signal profile at the connection point between the capacitor C1 and the second resistor R1 in the presence of an input signal as shown on the upper graph. As can clearly be seen, the circuit arrangement of the invention only indicates a zero transit in the output signal in response to relatively large changes of the input signal, whereby the interesting transit, which indicates the maximum in the input signal resulting from the end of the armature movement of a fuel injection valve actuated by means of a coil, occurs at about 2.6 ms.

It can be seen in the lower curve that the voltage at the connection point between the capacitor C1 and the second resistor R1, which corresponds approximately to the voltage at the inverting input 6 of the operational amplifier, is between about −0.7 V and +1 V, with the effect that, in spite of the second resistor R1, the differentiator does not exhibit a phase delay.

Figure 2:
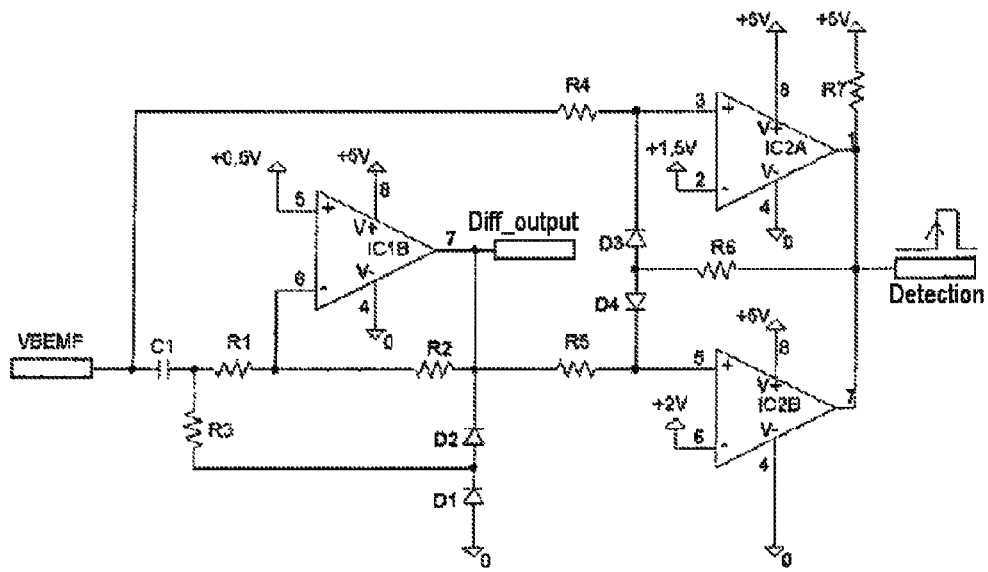
FIG. 2 a more developed circuit arrangement according to the invention.

A discriminator circuit according to FIG. 2 can be used in a favorable manner to extract the absolute maximum.

This, in addition to the circuit arrangement of the invention for detecting a maximum in the profile of a measurement signal, which has the same reference numbers as that of FIG. 1, comprises an extension to the circuit consisting of two comparators IC2A, IC2B, configured as Schmitt triggers. The outputs 1 and 7 respectively of the comparators IC2A and IC2B are connected for this purpose through a fourth resistor R6 and forward-biased diodes D3, D4, respectively, to their non-inverting inputs 3, 5 respectively.

The measurement signal from the VBEMF input of the circuit arrangement on the one hand, and a reference voltage of +1.5 V on the other hand are supplied to the comparator IC2A. The output signal from the differentiator on the one hand, and a reference voltage of +2 V on the other hand are supplied to the comparator IC2B. The reference voltages can, of course, be selected according to the particular application, and may be derived, for instance, from the supply voltages by means of a voltage divider.

The outputs of the comparators are connected to each other and, through a fifth resistor R7, to the positive supply potential. They create a logical AND combination, so that a signal only appears at the output of this discriminator circuit when, and for as long as, both the output of the differentiator and the measurement signal itself are at potentials above the reference potentials assigned to each.

The invention claimed is:

1. A circuit configuration for detecting a maximum in a profile of a measurement signal, the circuit configuration comprising:
   a first resistor;
   an operational amplifier having a negative supply potential, an inverting input, a non-inverting input connected to a reference potential being a positive potential, and an output connected through said first resistor to said inverting input;
   a series circuit having a capacitor and a second resistor, said capacitor directly connected to said second resistor;
   an input connection for applying the measurement signal too, said input connection connected to said inverting input of said operational amplifier through said series circuit having said capacitor and said second resistor;
   a third resistor;
   a first, reverse-biased diode;
   a second, forward-biased diode;
   a connection point between said capacitor and said second resistor connected through said third resistor and said first, reverse-biased diode to said negative supply potential of said operational amplifier; and
   a connection point between said third resistor and said first diode connected to said output of said operational amplifier through said second, forward-biased diode.

* * * * *